(12) United States Patent
Cheng (10) Patent No.: US 11,658,186 B2
(45) Date of Patent: May 23, 2023

(54) ARRAY SUBSTRATE AND DISPLAY DEVICE (71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 220 days.

(21) Appl. No.: 16/633,064

(22) PCT Filed: Aug. 1, 2019

(86) PCT No.: PCT/CN2019/098895
§ 371 (c)(1),
(2) Date: Jan. 22, 2020

(87) PCT Pub. No.: WO2020/029865
PCT Pub. Date: Feb. 13, 2020

(65) Prior Publication Data
US 2021/0066350 A1 Mar. 4, 2021

(30) Foreign Application Priority Data

Aug. 7, 2018 (CN) .......................... 201821266166.8

(51) Int. Cl.
H01L 27/12 (2006.01)
G02F 1/1362 (2006.01)

(52) U.S. Cl.
CPC ...... H01L 27/124 (2013.01); G02F 1/136286 (2013.01); H01L 27/1218 (2013.01)

(58) Field of Classification Search
CPC .......................... H01L 27/124; G02F 1/136286
See application file for complete search history.

(56) References Cited

U.S. PATENT DOCUMENTS

| 2003/0034492 | A1 | 2/2003 | Hayashi et al. |
| 2004/0256966 | A1* | 12/2004 | Su .......................... G02F 1/1345 313/38 |
| 2008/0001892 | A1 | 1/2008 | Kim et al. |
| 2009/0218576 | A1 | 9/2009 | Dairiki et al. |
| 2011/0115765 | A1 | 5/2011 | Chang |

(Continued)

FOREIGN PATENT DOCUMENTS

| CN | 101697053 A | 4/2010 |
| CN | 102253507 A | 11/2011 |

(Continued)

OTHER PUBLICATIONS

Decision to Grant dated Jul. 26, 2021 corresponding to Russian application No. 2020131773/28(057692).

(Continued)

*Primary Examiner* — Peter M Albrecht
(74) *Attorney, Agent, or Firm* — Nath, Goldberg & Meyer; Joshua B. Goldberg (57) ABSTRACT

The present disclosure provides an array substrate, including: a base, and at least one lead structure disposed on the base. The lead structure includes a first conductive structure and a conductive semiconductor structure, and an orthographic projection of the conductive semiconductor structure on the base at least partially overlaps an orthographic projection of the first conductive structure on the base.

13 Claims, 3 Drawing Sheets

(56) References Cited

U.S. PATENT DOCUMENTS

| | | |
|---|---|---|
| 2012/0098811 A1 | 4/2012 | Park |
| 2012/0206684 A1 | 8/2012 | Lee et al. |
| 2012/0211772 A1 | 8/2012 | Moh et al. |
| 2013/0113109 A1 | 5/2013 | Nagano et al. |
| 2016/0141314 A1 | 5/2016 | Zhang et al. |
| 2016/0358938 A1* | 12/2016 | Lee ................ H01L 27/124 |
| 2016/0358939 A1* | 12/2016 | Lee ................ H01L 27/124 |
| 2019/0348445 A1* | 11/2019 | Luo ............... G02F 1/136286 |

FOREIGN PATENT DOCUMENTS

| | | |
|---|---|---|
| CN | 203241671 U | 10/2013 |
| CN | 103399434 A | 11/2013 |
| CN | 106158881 A | 11/2016 |
| CN | 107785399 A | 3/2018 |
| CN | 208422916 U | 1/2019 |
| JP | 4085170 B2 | 5/2008 |
| KR | 20070076622 A | 7/2007 |
| TW | 201347119 A | 11/2013 |
| TW | 201640593 A | 11/2016 |
| TW | 201723776 A | 7/2017 |
| WO | 2015062273 A1 | 5/2015 |
| WO | 2018045822 A1 | 3/2018 |

OTHER PUBLICATIONS

First Office Action dated Jul. 15, 2021 corresponding to Korean Application No. 1020207025355.

Second Office Action dated Aug. 25, 2021 corresponding to Australian Application No. 2019318862.

First Office Action dated Feb. 26, 2021 for application No. AU2019318862.

Office Action dated Mar. 24, 2021 for application No. RU2020131773/28(057692) with English translation attached.

Office action dated Apr. 30, 2020 for application CN 108121681 with English Translation attached.

The Extended European Search Report dated Mar. 22, 2022 corresponding to application No. 19847864.6-1230.

* cited by examiner

ARRAY SUBSTRATE AND DISPLAY DEVICE

CROSS-REFERENCE TO RELATED APPLICATION

This is a National Phase Application filed under 35 U.S.C. 371 as a national stage of PCT/CN2019/098895, filed Aug. 1, 2019, an application claiming the benefit of Chinese Application No. 201821266166.8, filed Aug. 7, 2018, the content of each of which is hereby incorporated by reference in its entirety.

TECHNICAL FIELD

The present disclosure relates to the field of display technology, and particularly relates to an array substrate and a display device.

BACKGROUND

Due to different impedances of different leads on an array substrate, when different leads are used for conducting the same data signals, gate line signals or clock signals, data signals, gate line signals or clock signals obtained through different leads may be different, resulting in poor uniformity of images displayed by a display including the array substrate.

SUMMARY

In an embodiment of the present disclosure, there is provided an array substrate, including a display area and a fan-out area, wherein the array substrate includes: a base and at least one lead structure disposed on the base in the fan-out area. The lead structure includes a first conductive structure and a conductive semiconductor structure, and an orthographic projection of the conductive semiconductor structure on the base at least partially overlaps an orthographic projection of the first conductive structure on the base.

In some embodiments, the array substrate according to the embodiment of the present disclosure further includes a thin film transistor disposed on the base in the display area, and the first conductive structure is disposed in a same layer as a gate of the thin film transistor, and includes a same material as the gate of the thin film transistor.

In some embodiments, the conductive semiconductor structure is disposed in a same layer as an active layer of the thin film transistor; a gate insulating layer is disposed between the gate of the thin film transistor and the active layer of the thin film transistor; and the conductive semiconductor structure is disposed on a side of the base close to the gate insulating layer, and the first conductive structure is disposed on a side of the gate insulating layer away from the base.

In some embodiments, an interlayer insulating layer is disposed between a source and a drain of the thin film transistor and the active layer of the thin film transistor, and the source and the drain of the thin film transistor are disposed on a side of the interlayer insulating layer away from the base.

In some embodiments, the source and the drain of the thin film transistor are disposed on a side of the gate of the thin film transistor away from the base, and the interlayer insulating layer is disposed on a side of the gate insulating layer away from the base.

In some embodiments, the gate of the thin film transistor is disposed on a side of the source and the drain of the thin film transistor away from the base, and the gate insulating layer is disposed on a side of the interlayer insulating layer away from the base.

In some embodiments, the array substrate according to the embodiment of the present disclosure further includes a thin film transistor disposed on the base in the display area, and the first conductive structure is disposed in a same layer as a source and a drain of the thin film transistor, and includes a same material as the source and the drain of the thin film transistor.

In some embodiments, the conductive semiconductor structure is disposed in a same layer as an active layer of the thin film transistor; an interlayer insulating layer is disposed between the source and the drain of the thin film transistor and the active layer of the thin film transistor; and the conductive semiconductor structure is disposed on a side of the base close to the interlayer insulating layer, and the first conductive structure is disposed on a side of the interlayer insulating layer away from the base.

In some embodiments, a gate insulating layer is disposed between a gate of the thin film transistor and the active layer of the thin film transistor, and the gate of the thin film transistor is disposed on a side of the gate insulating layer away from the base.

In some embodiments, the source and the drain of the thin film transistor are disposed on a side of the gate of the thin film transistor away from the base, and the interlayer insulating layer is disposed on a side of the gate insulating layer away from the base.

In some embodiments, the gate of the thin film transistor is disposed on a side of the source and the drain of the thin film transistor away from the base, and the gate insulating layer is disposed on a side of the interlayer insulating layer away from the base.

In some embodiments, the lead structure further includes a second conductive structure, and an orthographic projection of the second conductive structure on the base at least partially overlaps the orthographic projection of the first conductive structure on the base.

In some embodiments, the first conductive structure is located between the second conductive structure and the conductive semiconductor structure with respect to the base.

In some embodiments, the array substrate includes a thin film transistor disposed on the base in the display area. One of the first conductive structure and the second conductive structure is disposed in a same layer as a gate of the thin film transistor, and includes a same material as the gate of the thin film transistor, and the other of the first conductive structure and the second conductive structure is disposed in a same layer as a source and a drain of the thin film transistor, and includes a same material as the source and the drain of the thin film transistor.

In some embodiments, the conductive semiconductor structure is disposed in a same layer as an active layer of the thin film transistor.

In some embodiments, a first insulating layer is disposed between the first conductive structure and the conductive semiconductor structure, a second insulating layer is disposed between the first conductive structure and the second conductive structure, and the first insulating layer and the second insulating layer are sequentially disposed on the base; and the conductive semiconductor structure is disposed on a side of the base close to the first insulating layer, the first conductive structure is disposed on a side of the first insulating layer away from the base, and the second conductive structure is disposed on a side of the second insulating layer away from the base.

In some embodiments, the array substrate includes a plurality of lead structures arranged in a direction parallel to an extension direction of the array substrate, and each of the lead structures includes a first conductive structure, a second conductive structure, and a conductive semiconductor structure, and in each lead structure, via holes are disposed on both sides of the first conductive structure, and the via holes penetrate the second insulating layer and the first insulating layer, such that the conductive semiconductor structure is electrically connected to the second conductive structure through the via holes.

In some embodiments, the array substrate includes a plurality of lead structures arranged in a direction parallel to an extension direction of the array substrate, each of the lead structures includes a first conductive structure, the plurality of lead structures share a single common second conductive structure, and the plurality of lead structures share a single common conductive semiconductor structure; and via holes are disposed on both sides of each first conductive structure and only one via hole is disposed between any two adjacent first conductive structures, and the via holes penetrate the second insulating layer and the first insulating layer such that the conductive semiconductor structure is electrically connected to the second conductive structure through the via holes.

In some embodiments, the second conductive structure includes metal.

In some embodiments, the conductive semiconductor structure includes a conductive low-temperature polysilicon layer.

In some embodiments, the first conductive structure includes metal.

In an embodiment of the present disclosure, there is further provided a display device including the array substrate as described above.

DETAILED DESCRIPTION

In order to enable those skilled in the art to better understand the technical solutions of the present disclosure, the present disclosure will be described in detail below with reference to accompanying drawings and specific embodiments.

Unless otherwise defined, technical or scientific terms used in the present disclosure are intended to have general meanings as understood by those of ordinary skill in the art. The words "first", "second" and similar terms used in the present disclosure do not denote any order, quantity, or importance, and are used merely for distinguishing different components. The word "comprising", "comprises" or the like means that an element, item preceding the word includes elements, items and equivalents thereof that appear after the word, and does not exclude other elements or items. The words "upper", "lower", or the like are merely used to indicate a relative positional relationship, and when an absolute positional relationship between the described objects is changed, the relative positional relationship may also be changed accordingly.

Figure 1:
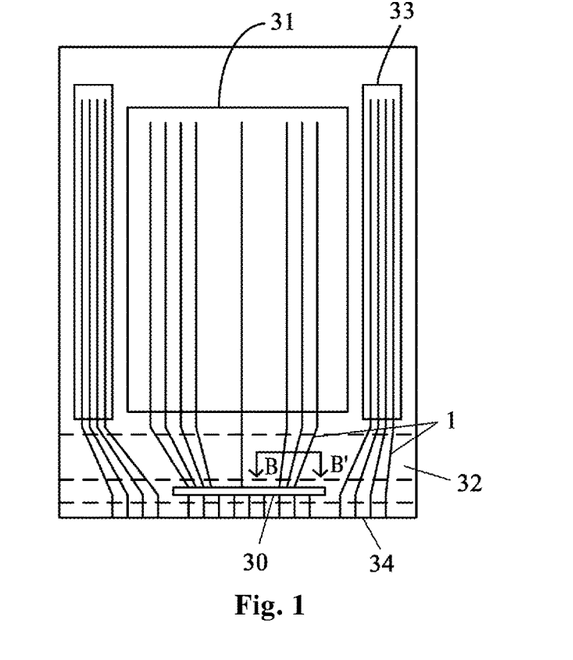
FIG. 1 is a schematic plan view showing a structure of an array substrate according to an embodiment of the present disclosure.
Figure 2:
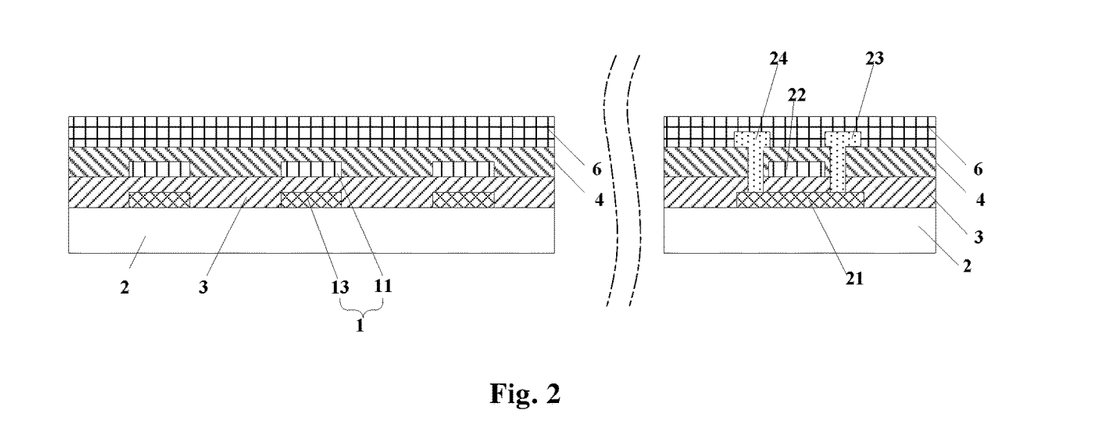
FIG. 2 shows an exemplary cross-sectional view of a lead structure in a fan-out area of the array substrate taken along line B-B' of FIG. 1 and a schematic cross-sectional view of a corresponding thin film transistor in a display area in an embodiment of the present disclosure.
Figure 3:
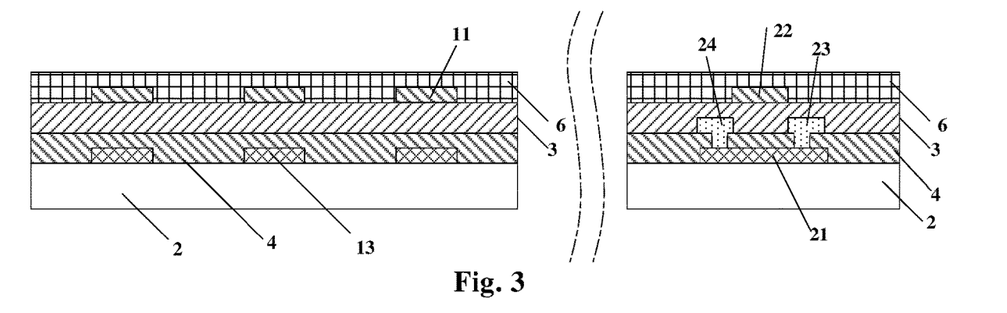
FIG. 3 shows an exemplary cross-sectional view of a lead structure in a fan-out area of the array substrate taken along line B-B' of FIG. 1 and a schematic cross-sectional view of a corresponding thin film transistor in a display area in an embodiment of the present disclosure.
Figure 4:
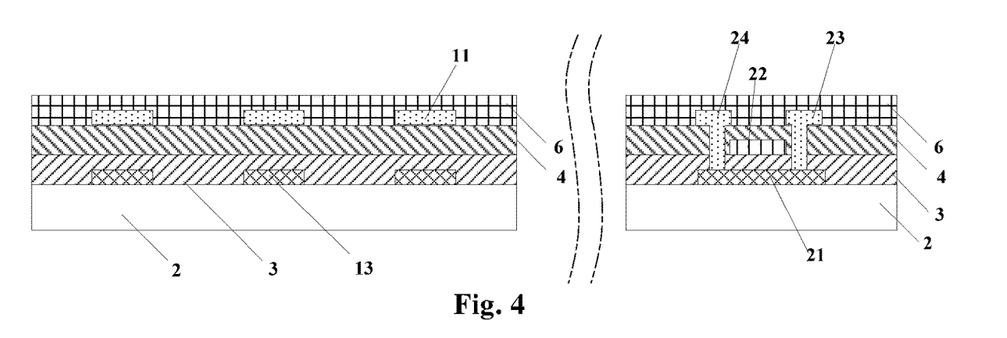
FIG. 4 shows an exemplary cross-sectional view of a lead structure in a fan-out area of the array substrate taken along line B-B' of FIG. 1 and a schematic cross-sectional view of a corresponding thin film transistor in a display area in an embodiment of the present disclosure.
Figure 5:
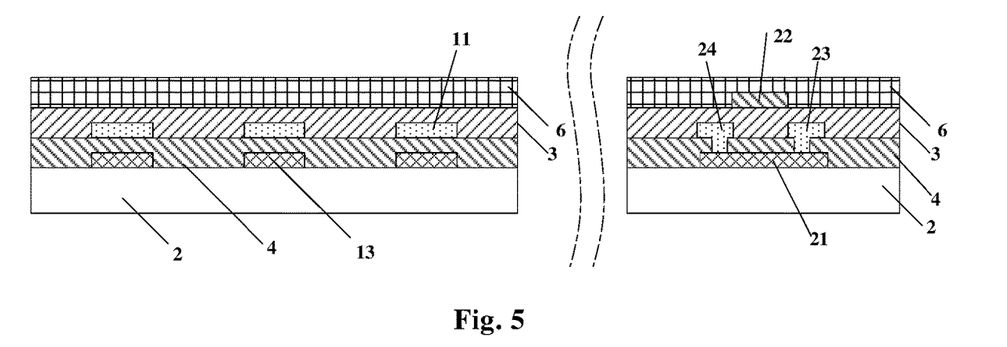
FIG. 5 shows an exemplary cross-sectional view of a lead structure in a fan-out area of the array substrate taken along line B-B' of FIG. 1 and a schematic cross-sectional view of a corresponding thin film transistor in a display area in an embodiment of the present disclosure.

FIG. 1 is a schematic plan view showing a structure of an array substrate according to an embodiment of the present disclosure. FIG. 2 shows an exemplary cross-sectional view of a lead structure in a fan-out area of the array substrate taken along line B-B' of FIG. 1 and a schematic cross-sectional view of a corresponding thin film transistor in a display area. FIG. 3 shows an exemplary cross-sectional view of a lead structure in a fan-out area of the array substrate taken along line B-B' of FIG. 1 and a schematic cross-sectional view of a corresponding thin film transistor in a display area. FIG. 4 shows an exemplary cross-sectional view of a lead structure in a fan-out area of the array substrate taken along line B-B' of FIG. 1 and a schematic cross-sectional view of a corresponding thin film transistor in a display area. FIG. 5 shows an exemplary cross-sectional view of a lead structure in a fan-out area of the array substrate taken along line B-B' of FIG. 1 and a schematic cross-sectional view of a corresponding thin film transistor in a display area.

As shown in FIGS. 1 to 5, in an embodiment of the present disclosure, there is provided an array substrate including a base 2 and at least one lead structure 1 disposed on the base 2. The lead structure 1 includes a first conductive structure 11 and a conductive semiconductor structure 13, and an orthographic projection of the conductive semiconductor structure 13 on the base 2 at least partially overlaps an orthographic projection of the first conductive structure 11 on the base 2. In some embodiments, as shown in FIGS. 2 to 5, the array substrate includes a plurality of lead structures 1.

As shown in FIG. 1, the array substrate includes a display area 31 and a fan-out area 32 outside the display area. In some embodiments, the at least one lead structure 1 is located in the fan-out area 32 of the array substrate. A circuitry in the fan-out area 32 is configured to connect a circuitry in the display area 31 to pads 34 via a driver integrated circuit (IC) 30, and connect a circuitry in a gate driver on array (GOA) 33 to the pads 34.

Since the lead structure 1 includes the conductive semiconductor structure 13, and the orthographic projection of the conductive semiconductor structure 13 on the base 2 at least partially overlaps the orthographic projection of the first conductive structure 11 on the base 2, the conductive semiconductor structure 13 and the first conductive structure 11 may interact with each other to form a parallel plate capacitor. In other words, the conductive semiconductor structure 13 may form a capacitor with the first conductive structure 11.

Capacitance of the parallel plate capacitor may be determined by the following Equation (1):

$$C=\varepsilon S/4\pi kd \qquad (1)$$

where C is the capacitance of the parallel plate capacitor, S is a facing area between the two plates of the parallel plate capacitor, d is a distance between the two plates of the parallel plate capacitor, ε is a relative dielectric constant between the two plates of the parallel plate capacitor, k is the electrostatic constant, and π is the circumference ratio.

According to the above Equation (1), regarding the capacitor formed by the conductive semiconductor structure 13 and the first conductive structure 11, the facing area between the conductive semiconductor structure 13 and the first conductive structure 11 can be adjusted by changing position and/or length of the conductive semiconductor structure 13, so as to adjust the capacitance of the capacitor.

Capacitive reactance of the parallel plate capacitor may be determined by the following Equation (2):

$$Xc=1/2\pi fC \qquad (2)$$

where Xc is the capacitive reactance of the parallel plate capacitor, π is the circumference ratio, f is a frequency of alternating current applied to the parallel plate capacitor, and C is the capacitance of the parallel plate capacitor.

According to the above Equation (2), regarding the capacitor formed by the conductive semiconductor structure 13 and the first conductive structure 11, the capacitive reactance of the capacitor can be adjusted by changing the capacitance of the capacitor, so as to adjust impedance of the first conductive structure 11 as one plate of the capacitor. Thus, in conjunction with the above Equations (1) and (2), the impedance of the first conductive structure 11 can be adjusted by adjusting the position and/or length of the conductive semiconductor structure 13 during fabrication of the array substrate. Therefore, in a case where the array substrate includes a plurality of first conductive structures 11, the impedance of each first conductive structure 11 can be adjusted by adjusting the position and/or length of the conductive semiconductor structure 13 forming a capacitor with that first conductive structure 11 during fabrication of the array substrate so that the respective first conductive structures 11 have a same or substantially a same impedance. In this case, when the plurality of first conductive structures 11 are expected to transmit a same data signal, gate line signal, or clock signal, it is ensured that each of the first conductive structures 11 actually outputs the same or substantially the same data signal, gate line signal, or clock signal, and thus the display effect of a display including the array substrate according to the embodiments of the present disclosure is improved.

In order to simplify fabrication process of the array substrate, in some embodiments, the array substrate includes a thin film transistor disposed on the base 2. In some embodiments, the first conductive structure 11 is disposed in a same layer as a gate 22 of the thin film transistor, and includes a same material as the gate 22 of the thin film transistor. In some embodiments, the first conductive structure 11 is disposed in a same layer as a source 23 and a drain 24 of the thin film transistor, and includes a same material as the source 23 and the drain 24 of the thin film transistor. In some embodiments, the conductive semiconductor structure 13 is disposed in a same layer as an active layer 21 of the thin film transistor.

In some embodiments, as shown in FIG. 2, when the first conductive structure 11 is disposed in the same layer as the gate of the thin film transistor, and the conductive semiconductor structure 13 is disposed in the same layer as the active layer 21 of the thin film transistor, a gate insulating layer 3 is disposed between the gate 22 of the thin film transistor and the active layer 21 of the thin film transistor, and the conductive semiconductor structure 13 is disposed on a side of the base 2 close to the gate insulating layer 3, while the first conductive structure 11 is disposed on a side of the gate insulating layer 3 away from the base 2. In this case, in some embodiments, as shown in FIG. 2, an interlayer insulating layer 4 is disposed between the source 23 and the drain 24 of the thin film transistor and the active layer 21 of the thin film transistor, and the source 23 and the drain 24 of the thin film transistor are disposed on a side of the interlayer insulating layer 4 away from the base 2. In this case, in some embodiments, as shown in FIG. 2, the source 23 and the drain 24 of the thin film transistor are disposed on a side of the gate 22 of the thin film transistor away from the base 2, and the interlayer insulating layer 4 is disposed on a side of the gate insulating layer 3 away from the base 2. However, the present disclosure is not limited thereto. For example, in some embodiments, as shown in FIG. 3, the gate 22 of the thin film transistor is disposed on a side of the source 23 and the drain 24 of the thin film transistor away from the base 2, and the gate insulating layer 3 is disposed on a side of the interlayer insulating layer 4 away from the base 2.

Therefore, according to the above embodiments of the present disclosure, the conductive semiconductor structure 13 of the fan-out area is disposed below the first conductive structure 11, and the impedance of the first conductive structure 11 can be adjusted by changing the position of the conductive semiconductor structure 13 below the first conductive structure 11 and/or the length of the conductive semiconductor structure 13, thereby ensuring that different first conductive structures 11 can output the same data signal, gate line signal, or clock signal, and improving the display effect of a display including the array substrate according to the embodiments of the present disclosure.

In some embodiments, as shown in FIG. 4, when the first conductive structure 11 is disposed in the same layer as the source 23 and the drain 24 of the thin film transistor, and the conductive semiconductor structure 13 is disposed in the same layer as the active layer 21 of the thin film transistor, an interlayer insulating layer 4 is disposed between the active layer 21 of the thin film transistor and the source 23 and the drain 24 of the thin film transistor, and the conductive semiconductor structure 13 is disposed on a side of the base 2 close to the interlayer insulating layer 4, while the first conductive structure 11 is disposed on a side of the interlayer insulating layer 4 away from the base 2. In this case, in some embodiments, as shown in FIG. 4, a gate insulating layer 3 is disposed between the gate 22 of the thin film transistor and the active layer 21 of the thin film transistor, and the gate 22 of the thin film transistor is disposed on a side of the gate insulating layer 3 away from the base 2. In this case, in some embodiments, as shown in FIG. 4, the source 23 and the drain 24 of the thin film transistor are disposed on a side of the gate 22 of the thin film transistor away from the base 2, and the interlayer insulating layer 4 is disposed on a side of the gate insulating layer 3 away from the base 2. However, the present disclosure is not limited thereto. For example, in some embodiments, as shown in FIG. 5, the gate 22 of the thin film transistor is disposed on a side of the source 23 and the drain 24 of the thin film transistor away from the base 2, and the gate insulating layer 3 is disposed on a side of the interlayer insulating layer 4 away from the base 2.

Therefore, according to the above embodiments of the present disclosure, the conductive semiconductor structure 13 is disposed below the first conductive structure 11, and the impedance of the first conductive structure 11 can be adjusted by changing the position of the conductive semiconductor structure 13 below the first conductive structure 11 and/or the length of the conductive semiconductor structure 13, thereby ensuring that different first conductive structures 11 can output the same data signal, gate line signal, or clock signal, and improving the display effect of a display including the array substrate according to the embodiments of the present disclosure.

In some embodiments, the array substrate further includes a passivation layer 6 that is used to protect one of the gate insulating layer 3 and the interlayer insulating layer 4 farther away from the base 2, and the passivation layer 6 is disposed on a side away from the base 2 of the one of the gate insulating layer 3 and the interlayer insulating layer 4 farther away from the base 2.

It will be appreciated that in some embodiments, positions of the source 23 and the drain 24 of the thin film transistor may be interchanged.

In some embodiments, the first conductive structure 11 is formed by a material including a metal. Metal materials have good electrical conductivity, which can help to adjust the impedance of the first conductive structure 11 using the conductive semiconductor structure 13. However, the present disclosure is not limited thereto. The first conductive structure 11 may include any material having a good conductivity that can help to adjust the impedance of the first conductive structure 11 using the conductive semiconductor structure 13.

In some embodiments, the conductive semiconductor structure 13 may include a conductive low-temperature polysilicon layer. However, the present disclosure is not limited thereto. That is, the conductive semiconductor structure 13 of the present disclosure is not limited to the conductive low-temperature polysilicon layer. In some embodiments, conductive low-temperature polysilicon may be obtained by doping phosphorus, boron, or the like into low-temperature polysilicon. However, the present disclosure is not limited thereto. That is, the method for preparing the conductive low-temperature polysilicon is not limited herein.

In summary, in the array substrate according to the embodiments of the present disclosure, the conductive semiconductor structure 13 may be disposed on the base 2 and may be at least partially overlapped with the first conductive structure 11, such that the conductive semiconductor structure 13 and the first conductive structure 11 form a capacitor. In this case, the impedance of the first conductive structure 11 can be adjusted by changing the position and/or length of the conductive semiconductor structure 13, thereby ensuring that that different first conductive structures 11 transmitting the same data signal, gate line signal, or clock signal have the same impedance, and improving the display effect of a display including the array substrate according to the embodiments of the present disclosure.

Figure 6:
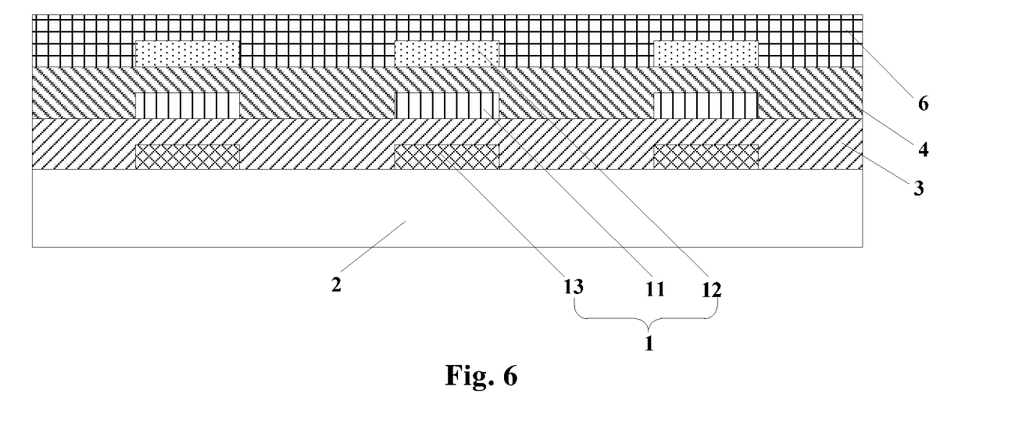
FIG. 6 shows an exemplary cross-sectional view of the array substrate taken along line B-B' of FIG. 1 in an embodiment of the present disclosure.
Figure 7:
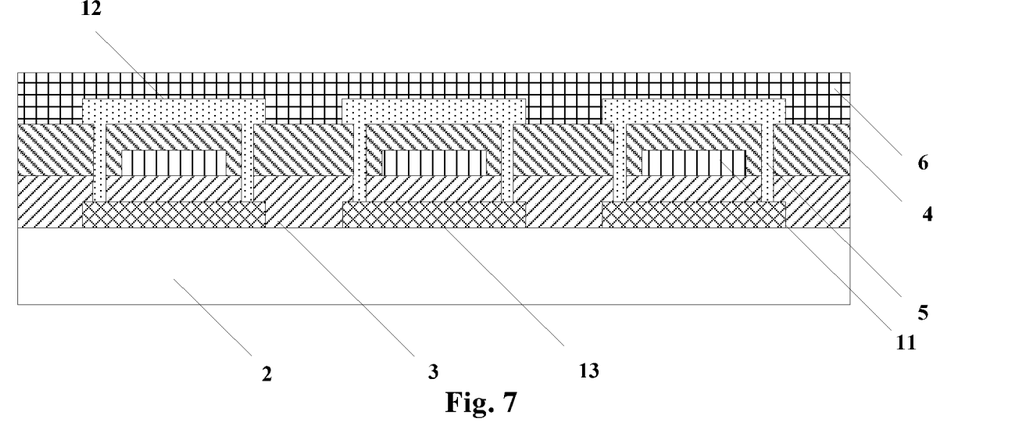
FIG. 7 shows an exemplary cross-sectional view of the array substrate taken along line B-B' of FIG. 1 in an embodiment of the present disclosure.
Figure 8:
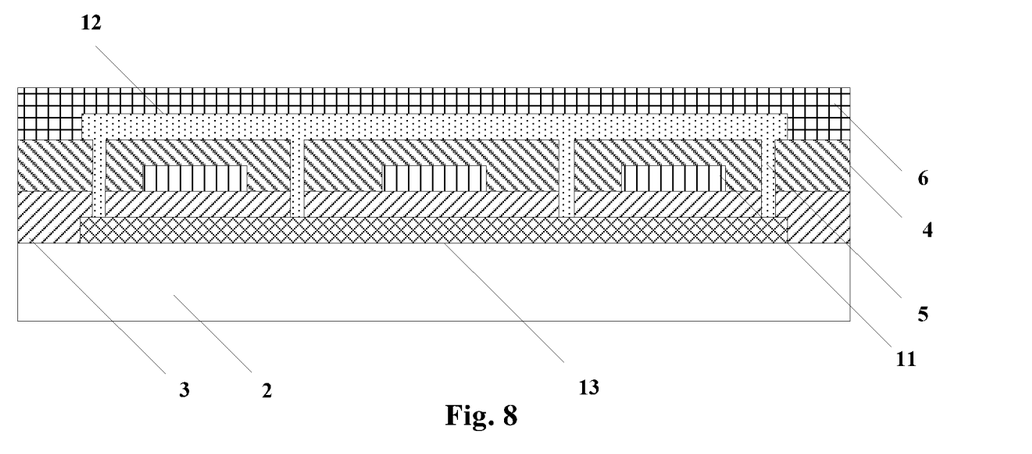
FIG. 8 shows an exemplary cross-sectional view of the array substrate taken along line B-B' of FIG. 1 in an embodiment of the present disclosure.

FIG. 6 shows an exemplary cross-sectional view of a lead structure in a fan-out area of the array substrate taken along line B-B' of FIG. 1. FIG. 7 shows an exemplary cross-sectional view of a lead structure in a fan-out area of the array substrate taken along line B-B' of FIG. 1. FIG. 8 shows an exemplary cross-sectional view of a lead structure in a fan-out area of the array substrate taken along line B-B' of FIG. 1.

As shown in FIGS. 6 to 8, in an embodiment of the present disclosure, there is provided an array substrate including a base 2, and at least one lead structure 1 disposed on the base 2. The lead structure 1 includes a first conductive structure 11, a conductive semiconductor structure 13, and a second conductive structure 12. An orthographic projection of the conductive semiconductor structure 13 on the base 2 at least partially overlaps an orthographic projection of the first conductive structure 11 on the base 2, and an orthographic projection of the second conductive structure 12 on the base 2 at least partially overlaps the orthographic projection of the first conductive structure 11 on the base 2. In some embodiments, as shown in FIGS. 6 to 8, the array substrate includes a plurality of lead structures 1.

Since the array substrate includes the conductive semiconductor structure 13 and the second conductive structure 12, and the orthographic projections of the conductive semiconductor structure 13 and the second conductive structure 12 on the base 2 each at least partially overlaps orthographic projection of the first conductive structure 11 on the base 2, the conductive semiconductor structure 13 may form a parallel plate capacitor with the first conductive structure 11, and the second conductive structure 12 may also form a parallel plate capacitor with the first conductive structure 11. In other words, the conductive semiconductor structure 13 and the second conductive structure 12 may each form a capacitor with the first conductive structure 11. Therefore, according to the above Equations (1) and (2), the impedance of the first conductive structure 11 can be adjusted by changing the positions and/or lengths of the conductive semiconductor structure 13 and the second conductive structure 12, thereby ensuring that different first conductive structures 11 transmitting the same data signal, gate line signal, or clock signal have the same impedance, and improving the display effect of a display including the array substrate according to the embodiments of the present disclosure. Furthermore, as described in detail below, since the conductive semiconductor structure 13 and the second conductive structure 12 each form a capacitor with the first conductive structure 11, the capacitor formed by the conductive semiconductor structure 13 and the first conductive structure 11 and the capacitor formed by the second conductive structure 12 and the first conductive structure 11 may be in series or in parallel. Therefore, the impedance of the second conductive structure 12 can be adjusted by changing the positions and/or lengths of the conductive semiconductor structure 13 and the first conductive structure 11, thereby ensuring that that different second conductive structures 12 transmitting the same data signal, gate line signal, or clock signal have a same impedance, and improving the display effect of a display including the array substrate according to the embodiments of the present disclosure.

In an embodiment of the present disclosure, as shown in FIGS. 6 to 8, the first conductive structure 11 is located between the second conductive structure 12 and the conductive semiconductor structure 13 with respect to the base 2.

In order to simplify the fabrication process of the array substrate, in some embodiments, the array substrate includes a thin film transistor disposed on the base 2. In some embodiments, one of the first conductive structure 11 and the second conductive structure 12 is disposed in the same layer as the gate of the thin film transistor, and includes the same material as the gate of the thin film transistor, and the other of the first conductive structure 11 and the second conductive structure 12 is disposed in the same layer as the source and the drain of the thin film transistor, and includes the same material as the source and the drain of the thin film transistor. In some embodiments, the conductive semiconductor structure 13 is disposed in the same layer as the active layer of the thin film transistor. In this case, in some embodiments, a first insulating layer is disposed between the first conductive structure 11 and the conductive semiconductor structure 13, a second insulating layer is disposed between the first conductive structure 11 and the second conductive structure 12, the first insulating layer and the second insulating layer are sequentially disposed on the base 2, the conductive semiconductor structure 13 is disposed on a side of the base 2 close to the first insulating layer, the first conductive structure 11 is disposed on a side of the first insulating layer away from the base 2, and the second conductive structure 12 is disposed on a side of the second insulating layer away from the base 2.

Specifically, positions of the first conductive structure 11, the second conductive structure 12, and the conductive semiconductor structure 13 are described in detail below by taking the case where the first conductive structure 11 is disposed in the same layer as the gate of the thin film transistor, the second conductive structure 12 is disposed in the same layer as the source and the drain of the thin film transistor, and the conductive semiconductor structure 13 is disposed in the same layer as the active layer of the thin film transistor. However, the present disclosure is not limited thereto. For example, in some embodiments, similar to the embodiment shown in FIG. 5, the first conductive structure 11 is disposed in the same layer as the source and the drain of the thin film transistor, the second conductive structure 12 is disposed in the same layer as the gate of the thin film transistor, and the conductive semiconductor structure 13 is disposed in the same layer as the active layer of the thin film transistor.

As shown in FIG. 6, similar to the embodiment shown in FIG. 3, in the case where the first conductive structure 11 is disposed in the same layer as the gate of the thin film transistor, the second conductive structure 12 is disposed in the same layer as the source and the drain of the thin film transistor, and the conductive semiconductor structure 13 is disposed in the same layer as the active layer of the thin film transistor, a gate insulating layer 3 (corresponding to the first insulating layer) is disposed between the gate and the active layer of the thin film transistor, an interlayer insulating layer 4 (corresponding to the second insulating layer) is disposed between the gate of the thin film transistor and the source and the drain of the thin film transistor, the gate insulating layer 3 and the interlayer insulating layer 4 are sequentially disposed on the base 2, and the conductive semiconductor structure 13 is disposed on a side of the base 2 close to the gate insulating layer 3, the first conductive structure 11 is disposed on a side of the gate insulating layer 3 away from the base 2, and the second conductive structure 12 is disposed on a side of the interlayer insulating layer 4 away from the base 2.

Therefore, in the array substrate according to the embodiments of the present disclosure, the second conductive structure 12 is disposed above the first conductive structure 11, and the conductive semiconductor structure 13 is disposed below the first conductive structure 11. Therefore, when it is required to adjust the impedance of the first conductive structure 11, the impedance of the first conductive structure 11 can be adjusted by adjusting the position and/or length of the second conductive structure 12 located above the first conductive structure 11 and by adjusting the position and/or length of the conductive semiconductor structure 13 located below the first conductive structure 11 during fabrication of the array substrate, thereby ensuring that different first conductive structures 11 can output the same data signal, gate line signal, or clock signal, and improving the display effect of a display including the array substrate according to the embodiments of the present disclosure. Furthermore, in the embodiment shown in FIG. 6, since the capacitor formed by the conductive semiconductor structure 13 and the first conductive structure 11 and the capacitor formed by the second conductive structure 12 and the first conductive structure 11 are in series, capacitive reactance of the two capacitors can be adjusted by adjusting the positions and/or lengths of the conductive semiconductor structure 13 and the first conductive structure 11 respectively, so as to adjust the impedance of the second conductive structure 12, thereby ensuring that different second conductive structures 12 transmitting the same data signal, gate line signal, or clock signal have the same impedance, and improving the display effect of a display including the array substrate according to the embodiments of the present disclosure.

In the embodiments of the present disclosure, the first conductive structure 11 and the second conductive structure 12 are configured to transmit data signals, gate line signals, or clock signals. However, the present disclosure is not limited thereto, and the first conductive structure 11 or the second conductive structure 12 may also be configured to transmit other signals.

In some embodiments, the array substrate includes a plurality of lead structures 1 arranged in a direction parallel to an extension direction of the array substrate. Each of the lead structures 1 includes a first conductive structure 11 on both sides of which via holes 5 are disposed. The via holes 5 penetrate the first insulating layer and the second insulating layer so that the conductive semiconductor structure 13 is connected to the second conductive structure 12 through the via holes 5.

In some embodiments, as shown in FIG. 7, the array substrate includes a plurality of lead structures 1 arranged in a direction parallel to an extension direction of the array substrate. Each of the lead structures 1 includes a first conductive structure 11, a second conductive structure 12, and a conductive semiconductor structure 13. In this case, in each of the lead structures 1, via holes 5 are disposed on both sides of the first conductive structure 11 of the lead structures 1, that is, each first conductive structure 11 corresponds to two via holes 5 which penetrate the gate insulating layer 3 and the interlayer insulating layer 4 so that the second conductive structure 12 is electrically connected to the conductive semiconductor structure 13 through these two via holes 5 to form a closed, ring surrounding the first conductive structure 11 by the second conductive structure 12 and the conductive semiconductor structure 13. In this case, according to the principle of electrostatic shielding, the closed ring can isolate the first conductive structure 11 from the outside so that the first conductive structure 11 is prevented from damages of external static electricity, and lifetime of the array substrate according to the embodiments of the present disclosure is prolonged.

In some embodiments, as shown in FIG. 8, the array substrate includes a plurality of lead structures 1 arranged in a direction parallel to an extension direction of the array substrate. Each of the lead structures includes a first conductive structure 11, the plurality of lead structures 1 share a single common second conductive structure 12, and the plurality of lead structures 1 share a single common conductive semiconductor structure 13. In this case, via holes 5 are disposed on both sides of each first conductive structure 11, and only one via hole 5 is disposed between any two adjacent first conductive structures 11. Such an arrangement of the plurality of lead structures 1 can increase an area of each closed ring, so as to further ensure that the first conductive structure 11 is prevented from damages of external static electricity, and the lifetime of the array substrate according to the embodiments of the present disclosure is prolonged.

Further, in the embodiments shown in FIGS. 7 and 8, since the capacitor formed by the conductive semiconductor structure 13 and the first conductive structure 11 and the capacitor formed by the second conductive structure 12 and the first conductive structure 11 are in parallel, the capacitive reactance of the two capacitors can be adjusted by adjusting the positions and/or lengths of the conductive semiconductor structure 13 and the first conductive structure 11 respectively, so as to adjust the impedance of the second conductive structure 12, thereby ensuring that different second conductive structures 12 transmitting the same data signal, gate line signal, or clock signal have the same impedance, and improving the display effect of a display including the array substrate according to the embodiments of the present disclosure.

In some embodiments, the first conductive structure 11 and the second conductive structure 12 are formed by a material including a metal. Metal materials have good electrical conductivity, which can help to adjust the impedance of the first conductive structure 11 using the conductive semiconductor structure 13 and the second conductive structure 12, and to adjust the impedance of the second conductive structure 12 using the conductive semiconductor structure 13 and the first conductive structure 11. However, the present disclosure is not limited thereto. The material forming the first conductive structure 11 may include any material having a good conductivity that can help to adjust the impedance of the first conductive structure 11 using the conductive semiconductor structure 13 and the second conductive structure 12, and the material forming the second conductive structure 12 may include any material having a good conductivity that can help to adjust the impedance of the second conductive structure 12 using the conductive semiconductor structure 13 and the first conductive structure 11.

In some embodiments, the conductive semiconductor structure 13 may include a conductive low-temperature polysilicon layer. However, the present disclosure is not limited thereto. That is, the conductive semiconductor structure 13 of the present disclosure is not limited to a conductive low-temperature polysilicon layer. In some embodiments, conductive low-temperature polysilicon may be obtained by doping phosphorus, boron, or the like into low-temperature polysilicon. However, the present disclosure is not limited thereto. That is, the method for preparing the conductive low-temperature polysilicon is not limited herein.

In summary, in the array substrate provided in the embodiments of the present disclosure, the conductive semiconductor structure 13, the first conductive structure 11, and the second conductive structure 12 may be disposed sequentially on the base 2, and the conductive semiconductor structure 13 and the second conductive structure 12 each may be at least partially overlapped with the first conductive structure 11, such that the conductive semiconductor structure 13 and the second conductive structure 12 each form a capacitor with the first conductive structure 11. In this case, the impedance of the first conductive structure 11 can be adjusted by changing the positions and/or lengths of the conductive semiconductor structure 13 and the second conductive structure 12, thereby ensuring that different first conductive structures 11 transmitting the same data signal, gate line signal, or clock signal have the same impedance, and improving the display effect of a display including the array substrate according to the embodiments of the present disclosure. In addition, the impedance of the second conductive structure 12 can be adjusted by changing the positions and/or lengths of the conductive semiconductor structure 13 and the first conductive structure 11, thereby ensuring that different second conductive structures 12 transmitting the same data signal, gate line signal, or clock signal have the same impedance, and improving the display effect of a display including the array substrate according to the embodiments of the present disclosure.

In an embodiment of the present disclosure, there is further provided a display device including the array substrate according to any of the embodiments disclosed herein. Images displayed by the display device according to the embodiment of the present disclosure have a good display effect, since the array substrate according to the embodiments of the present disclosure is included in the display device.

The display device may include: a liquid crystal panel, an electronic paper, a mobile phone, a tablet, a television, a monitor, a notebook computer, a digital album, a navigator, or any other product or component having a display function.

It will be appreciated that the above embodiments are merely exemplary embodiments for the purpose of illustrating the principle of the disclosure, and the disclosure is not limited thereto. Various modifications and improvements can be made by an ordinary skilled in the art without departing from the spirit and essence of the disclosure. Accordingly, all of the modifications and improvements also fall into the protection scope of the disclosure.

What is claimed is:

1. An array substrate, comprising a display area and a fan-out area,
wherein the array substrate comprises a base and at least one lead structure disposed on the base in the fan-out area, the at least one lead structure comprises a first conductive structure and a conductive semiconductor structure, an orthographic projection of the conductive semiconductor structure on the base at least partially overlaps an orthographic projection of the first conductive structure on the base, at least one insulating layer is provided between the conductive semiconductor structure and the first conductive structure, and a part of the conductive semiconductor structure opposite to the first conductive structure in a direction perpendicular to the base is doped,
wherein the at least one lead structure further comprises a second conductive structure, and an orthographic projection of the second conductive structure on the base at least partially overlaps the orthographic projection of the first conductive structure on the base,
the first conductive structure is located between the second conductive structure and the conductive semiconductor structure with respect to the base, the array substrate comprises a thin film transistor disposed on the base in the display area;

wherein one of the first conductive structure and the second conductive structure is disposed in a same layer as a gate of the thin film transistor, and comprises a same material as the gate of the thin film transistor, and the other of the first conductive structure and the second conductive structure is disposed in a same layer as a source and a drain of the thin film transistor, and comprises a same material as the source and the drain of the thin film transistor, the conductive semiconductor structure is disposed in a same layer as an active layer of the thin film transistor, a first insulating layer is disposed between the first conductive structure and the conductive semiconductor structure, a second insulating layer is disposed between the first conductive structure and the second conductive structure, and the first insulating layer and the second insulating layer are sequentially disposed on the base; and the conductive semiconductor structure is disposed on a side of the base proximal to the first insulating layer, the first conductive structure is disposed on a side of the first insulating layer distal to the base, and the second conductive structure is disposed on a side of the second insulating layer distal to the base, the at least one lead structure comprises a plurality of lead structures arranged in a direction parallel to an extension direction of the array substrate, each of the lead structures comprises a first conductive structure, the plurality of lead structures share a single common second conductive structure, and the plurality of lead structures share a single common conductive semiconductor structure; and via holes are disposed on two sides of the first conductive structure and only one via hole is disposed between any two adjacent first conductive structures, and the via holes penetrate the second insulating layer and the first insulating layer such that the single common conductive semiconductor structure is electrically connected to the single common second conductive structure through the via holes.

2. The array substrate according to claim 1, wherein the first conductive structure is disposed in a same layer as the gate of the thin film transistor, and comprises a same material as the gate of the thin film transistor.

3. The array substrate according to claim 2, wherein
a gate insulating layer is disposed between the gate of the thin film transistor and the active layer of the thin film transistor; and
the conductive semiconductor structure is disposed on a side of the base proximal to the gate insulating layer, and the first conductive structure is disposed on a side of the gate insulating layer distal to the base.

4. The array substrate according to claim 3, wherein an interlayer insulating layer is disposed between the source and the drain of the thin film transistor and the active layer of the thin film transistor, and the source and the drain of the thin film transistor are disposed on a side of the interlayer insulating layer distal to the base.

5. The array substrate according to claim 4, wherein the source and the drain of the thin film transistor are disposed on a side of the gate of the thin film transistor distal to the base, and the interlayer insulating layer is disposed on the side of the gate insulating layer distal to the base.

6. The array substrate according to claim 4, wherein the gate of the thin film transistor is disposed on a side of the source and the drain of the thin film transistor distal to the base, and the gate insulating layer is disposed on a side of the interlayer insulating layer distal to the base.

7. The array substrate according to claim 1, wherein the first conductive structure is disposed in a same layer as the source and the drain of the thin film transistor, and comprises a same material as the source and the drain of the thin film transistor.

8. The array substrate according to claim 7, wherein
an interlayer insulating layer is disposed between the source and the drain of the thin film transistor and the active layer of the thin film transistor; and
the conductive semiconductor structure is disposed on a side of the base proximal to the interlayer insulating layer, and the first conductive structure is disposed on a side of the interlayer insulating layer distal to the base.

9. The array substrate according to claim 8, wherein a gate insulating layer is disposed between the gate of the thin film transistor and the active layer of the thin film transistor, and the gate of the thin film transistor is disposed on a side of the gate insulating layer distal to the base.

10. The array substrate according to claim 9, wherein the source and the drain of the thin film transistor are disposed on a side of the gate of the thin film transistor distal to the base and the interlayer insulating layer is disposed on the side of the gate insulating layer distal to the base, or the gate of the thin film transistor is disposed on a side of the source and the drain of the thin film transistor distal to the base and the gate insulating layer is disposed on the side of the interlayer insulating layer distal to the base.

11. The array substrate according to claim 1, wherein the second conductive structure comprises metal.

12. The array substrate according to claim 1, wherein the conductive semiconductor structure comprises a conductive low-temperature polysilicon layer, or the first conductive structure comprises metal.

13. A display device, comprising the array substrate according to claim 1.

* * * * *